United States Patent [19]
Lesyk et al.

[11] 3,973,714
[45] Aug. 10, 1976

[54] COMPLIANT BONDING METHOD

[75] Inventors: Joseph N. Lesyk, Allentown; David P. Ludwig, Whitehall; Jack J. Monahan, Allentown, all of Pa.

[73] Assignee: Western Electric Company, Inc., New York, N.Y.

[22] Filed: Jan. 13, 1975

[21] Appl. No.: 540,474

Related U.S. Application Data

[60] Continuation of Ser. No. 383,415, July 27, 1973, abandoned, which is a division of Ser. No. 173,447, Aug. 20, 1971, Pat. No. 3,771,711.

[52] U.S. Cl. .................................. 228/106; 228/5.5
[51] Int. Cl.² .......................................... B23K 1/00
[58] Field of Search .................. 156/73; 228/4, 5.5, 228/44, 49, 106, 237, 212; 14/520

[56] References Cited
UNITED STATES PATENTS

| | | | |
|---|---|---|---|
| 3,627,190 | 12/1971 | Ramsey | 228/5.5 |
| 3,693,473 | 9/1972 | Beachner | 74/520 |
| 3,696,985 | 10/1972 | Herring et al. | 228/5.5 |

*Primary Examiner*—Robert D. Baldwin
*Assistant Examiner*—Gus T. Hampilos
*Attorney, Agent, or Firm*—R. Y. Peters

[57] ABSTRACT

Compliant bonding of successive beam-lead semiconductor devices to successive metallic patterns on substrates is accomplished with a bonding apparatus that uses an indexable compliant member. A bonding head of the apparatus is provided with a single movable tip which disengages from the compliant member during indexing of the member. The movable tip engages with a portion of the compliant member that is suspended between two drive sprockets when it is desired to perform a bonding operation. The engagement of the tip with the compliant member produces tension in the member. The tension results in a precise and flat configuration within the engaged portion of the member. The flat configuration enhances accurate alignment of workpieces to the compliant member.

A toggle linkage is described as a desirable system for moving the bonding tip with respect to the head.

9 Claims, 6 Drawing Figures

3,973,714

COMPLIANT BONDING METHOD

This is a continuation, of application Ser. No. 383,415 filed July 27, 1973 now abandoned which is a division of application Ser. No. 173,447 filed on Aug. 20, 1971, now U.S. Pat. No. 3,771,711.

BACKGROUND OF THE INVENTION

1. Field of the Invention

This invention relates to improved methods for compliant bonding, and more particularly to methods for producing compliant bonds between beam-lead semiconductor devices and metallic patterns on substrates.

2. Description of the Prior Art

When bonding beam-lead semiconductor articles, such as integrated-circuit chips, to substrates, it is highly advantageous to employ a technique known as compliant bonding. Compliant bonding is described in U.S. Pat. No. 3,533,155 issued to A. Coucoulas on Oct. 13, 1970.

A particularly efficient technique for adapting compliant bonding to high-speed production operations is described in patent application Ser. No. 863,259 filed in the name of D. P. Ludwig on Oct. 2, 1969 now U.S. Pat. No. 3,690,444 and assigned to the assignee of record of this application. The system described in the Ludwig application involves sequentially placing an unused portion of a compliant bonding strip onto a bonding axis with each successive bonding operation. This is accomplished by preliminarily engaging the compliant member with portions of a heated turret-like bonding head and then subsequently rotating the bonding head to bring various bonding tips of the head into position on a bonding axis.

While the Ludwig system is fully workable, there is some desire to provide a bonding apparatus which will operate with not only all of the advantages of the Ludwig system, but also will operate with greater accuracy and reliability.

SUMMARY OF THE INVENTION

It is therefore an object of this invention to provide a bonding system which will facilitate compliant bonding with a sequentially indexable compliant bonding strip wherein such bonding is performed with a single bonding tip.

Another object of the invention is to accomplish such bonding without causing preliminary heating of a bonding portion of a compliant member before placing the portion in a bonding position.

These objects are achieved by a method of compliant bonding, wherein a compliant member is indexably positionable between a bonding tip and a workpiece to be bonded. The method may include indexing the compliant member relative to the tip and sequentially operating the bonding tip to move it linearly along its axis. Such movement results in engaging the bonding tip with one side of the compliant member and engaging the workpiece with the other side of the compliant member and removably mounting the workpiece to such side. This movement also results in bonding the workpiece and releasing it from the compliant member, and in releasing the tip from the compliant member to enable further indexing of the tip.

BRIEF DESCRIPTION OF THE DRAWINGS

Other objects and features of the present invention will be more readily understood from the following detailed description of specific embodiments thereof, when read in conjunction with the appended drawings in which.

DETAILED DESCRIPTION

Figure 1:
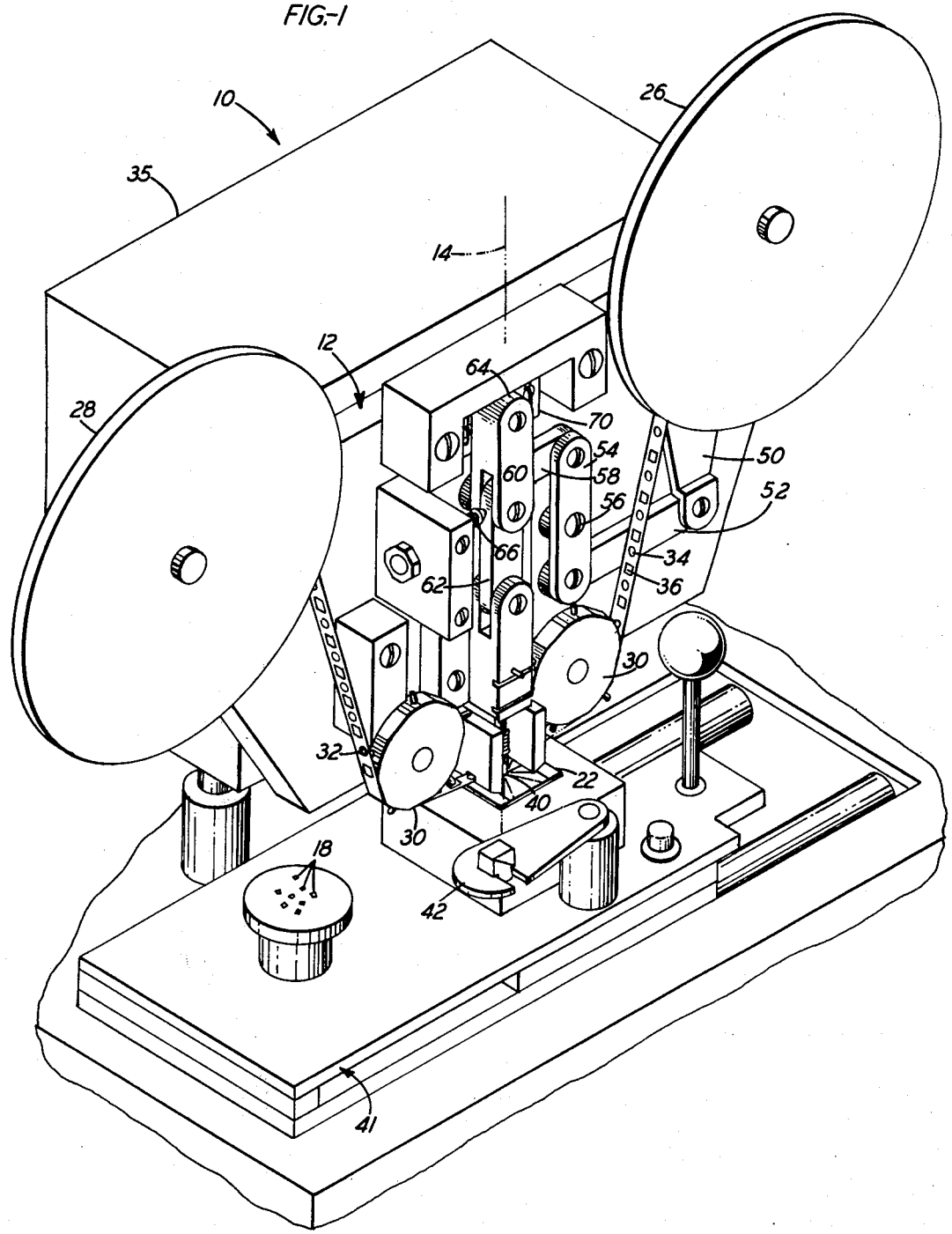
FIG. 1 is a perspective view of a bonding apparatus employing an inventive single-tip, indexable compliant-bonding head.
Figure 2:
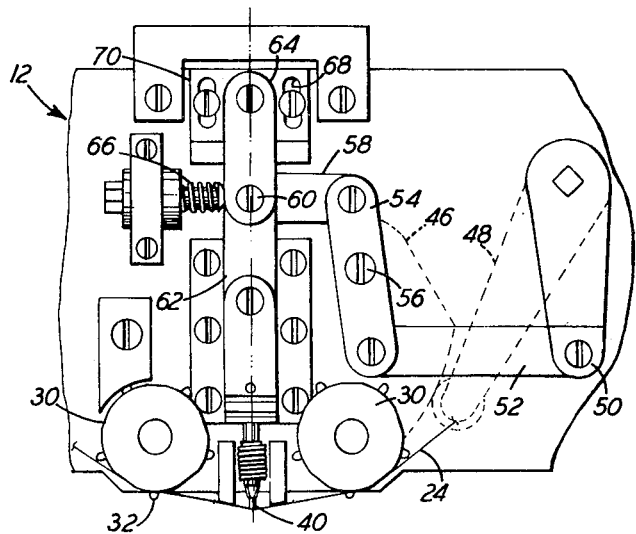
FIG. 2 is an elevational view of the inventive bonding head showing the movable bonding tip in an extended or engaged position.

A bonding machine, designated generally by the numeral 10, is illustrated in FIG. 1. The machine 10 includes a bonding head, designated generally by the numeral 12. The bonding head 12 is arranged to be moved up and down along a bonding axis 14.

The purpose of the bonding machine 10 is to provide sound thermocompression bonds between beam leads of semiconductor devices or chips, designated generally by the numeral 18, and metallic patterns formed on substrates 22. The desired bonding is accomplished by compressing the leads against the metallic pattern with a compliant strip or member 24 is described in Coucoulas U.S. Pat. No. 3,533,155 and the aforementioned D. P. Ludwig application Ser. No. 863,259, now U.S. Pat. No. 3,771,711.

As described in the Ludwig application, it is desirable to perform each bonding operation with an unused portion of the compliant member 24. Thus, it is convenient to operate the machine 10 with a continuous strip of the compliant member which is continuously supplied from a reel 26 and wound onto a reel 28.

Figure 6:
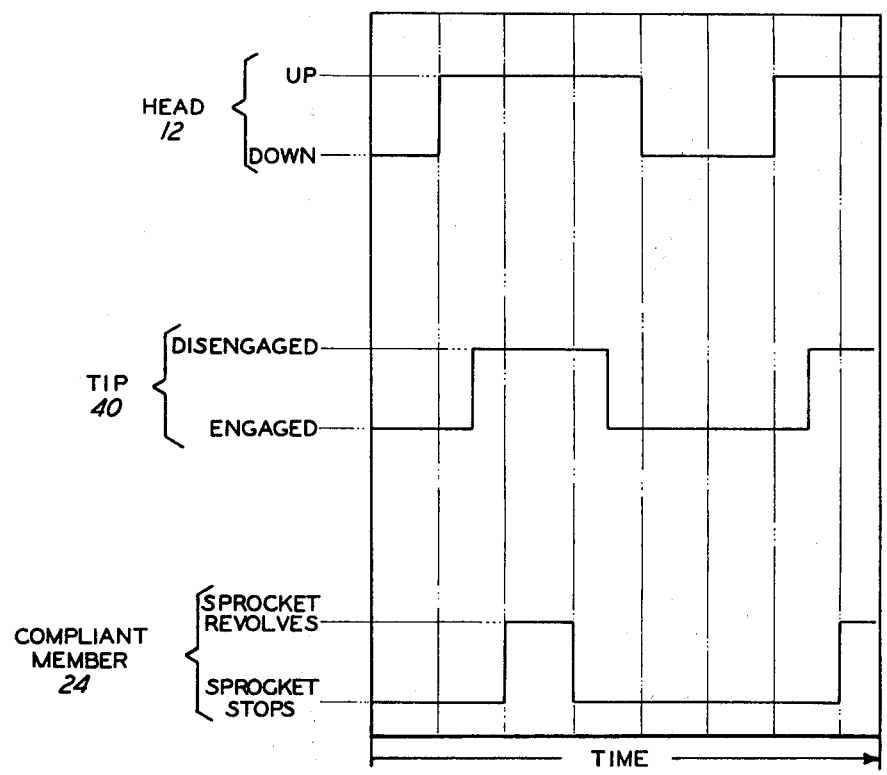
FIG. 6 is a timing diagram showing the interrelation of various mechanical motions of the machine of FIG. 1.

The machine 10 operates in accordance with a timing sequence illustrated in FIG. 6.

The operation involves indexing of the compliant member 24 across the bonding head 12. This is accomplished by driving the member 24 with sprockets 30. Each of the sprockets 30 is provided with projections 32 which engage with sprocket holes 34 punched in the compliant member 24. A conventional drive system 35 is provided to index the sprockets 30 in predetermined rotational steps to accomplish an accurate positioning of successive bonding apertures 36 onto the bonding axis 14.

After one of the apertures 36 is positioned on the bonding axis 14, the drive system 35 moves a heated bonding tip 40 against the compliant member 24 to produce tension in that portion of the member which is suspended between the two vertical supporting devices of the housing that are on opposite sides of the tip 40 and between the two sprockets 30. The movement of the tip 40 and the tensioning of the member 24 is accomplished prior to any movement of the bonding head 12 toward the chips 18. One of the chips 18 is then positioned on the bonding axis 14 by an operator using a conventional manipulator assembly, designated generally by the numeral 41, and a prism-type optical system 42 combined with a microscope (not shown). The aligned chip 18 is engaged with the compliant member 24 by utilizing a vacuum source (not shown) operating through a vacuum port 44 in the bonding tip 40 (see FIG. 3). One of the substrates 22 is then aligned to the engaged chip 18 using the conventional manipulator assembly 41.

After alignment of the chip 18 and the metallic pattern of the substrate 22, the bonding head 12, including the bonding tip 40 and the compliant member 24, is lowered along the axis 14 to accomplish compliant bonding between the leads and the metallic pattern. Upon completion of the bond, the head 12 is raised and the tip 40 is released from the compliant member 24, thereby eliminating the tension in the span of the member between the sprockets 30. The sprockets 30 are rotatably indexed to bring a subsequent one of the apertures 36 into the bonding axis 14 and a new cycle of bonding begins. Thus, the tip 40 operates synchronously with the indexing of the compliant member 24.

It can be readily seen that the portion of the member 24 which is to be involved in bonding is not subjected to any heating until that portion is positioned on the bonding axis 14. The portion of the member 24 engaged with the sprockets 30 remains at ambient temperature. Since the sprockets 30 engage with a portion of the member 24 at ambient temperature there is no need to allow for thermal expansion differentials which occur when the compliant member is formed of a material different than the sprockets 30. The inventive design of the machine 10 provides accurate indexing of the compliant member 24 irrespective of the coefficient of thermal expansion of the material used for the member 24.

FIGS. 2 through 5 illustrate one desirable embodiment of the bonding head 12 in which the bonding tip 40 is movable with respect to the head to alternately produce and release tension within the span of the compliant member 24 suspended between the vertically supporting devices and the sprockets 30. The head 12 illustrated in FIGS. 2 through 5 utilizes a toggle linkage to move the bonding tip 40 along the axis 14.

A cam 46 operates the toggle linkage by driving a cam follower arm 48 outwardly when it is desired to lower the bonding tip 40 along the axis. The follower arm 48 is connected to a link 50 which is, in turn, connected to a link 52 which is, still in turn, connected to a pivotal link 54 that pivots about a pivot screw 56. As the link 54 rotates in a counterclockwise direction, a horizontal connecting link 58 positions a toggle pivot point 60 onto the bonding axis 14. When the point 60 is on the bonding axis, toggle bar members 62 and 64 are aligned with the axis and the bonding tip 40 is in its lowermost position. A spring-biased catch assembly 66 provides the necessary snap action to the toggle operation.

The vertical position of the toggle members 62 and 64 is adjustable through slotted holes 68 in a member 70 to which the toggle member 64 is mounted. By adjusting the vertical position of the toggle members 62 and 64, the position of the bonding tip 40 can be accurately controlled.

Figure 3:
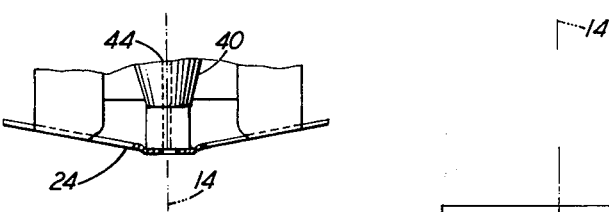
FIG. 3 is an enlarged view of an encircled portion of the bonding tip of FIG. 2.

When the tip 40 is engaged with the compliant member 24, as shown in FIG. 3, the engaged portion of the compliant member can be accurately aligned to the semiconductor chips 18 and the substrates 22 for bonding. It is necessary to provide the tension-induced engagement between the member 24 and the tip 40 in order to establish a uniformly flat surface across the engaged portion of the compliant member. If the compliant member 24 were not flat and tightly engaged with the tip 40, it would be virtually impossible to achieve accurate alignment between the chips 18 and the metallic pattern of the substrates 22. It should be noted that the establishing of the flat surface is accomplished prior to moving or lowering the bonding head 12.

Figure 4:
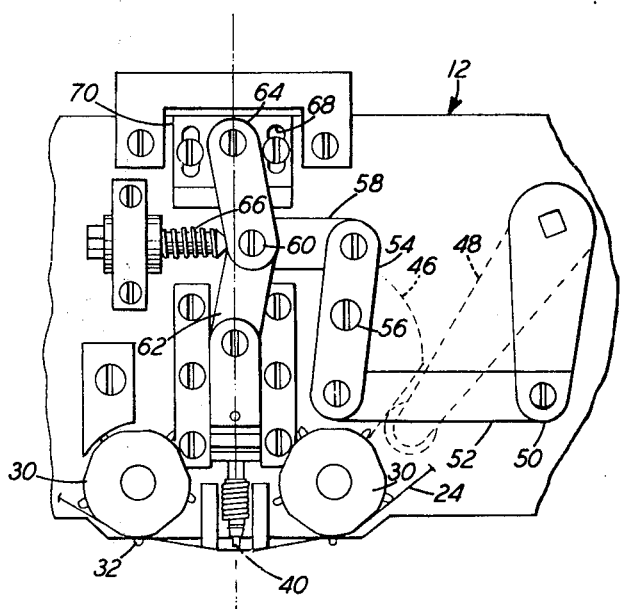
FIG. 4 is an elevational view of the bonding head of FIG. 2 showing a bonding tip in an retracted or disengaged position.
Figure 5:
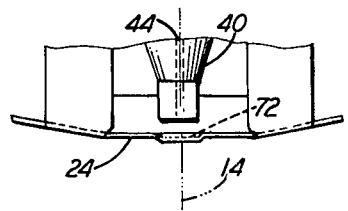
FIG. 5 is an enlarged view of an encircled portion of the bonding tip of FIG. 4.

It is apparent that indexing of the compliant member 24 cannot be accomplished when there is a tight engagement between the compliant member and the tip 40. Thus, it is necessary to release the tip 40 from the compliant member 24 after a bond is completed so that an unused portion of the compliant member can be brought onto the bonding axis 14. The release of the bonding tip 40 as shown in FIGS. 4 and 5 is accomplished by further rotation of the cam 46 to permit the cam follower arm 48 to move inwardly. The inward motion of the cam follower arm 48 reverses the movement of the various linkage members and causes the toggle assembly to shorten and thus retract the bonding tip 40.

Additional advantages in achieving precise alignment can be derived from pre-forming or embossing the compliant member with pocket-like depressions 72 within the area of the bonding aperture 36. Such an arrangement is illustrated in FIGS. 3 and 5. The depressions 72 help to position the bonding apertures 36 with respect to the bonding tip 40 when the tip is engaged with the member 24. Additionally the structural configuration of the depressions 72 provides an increased probability for achieving perfectly flat contact between the tip 40 and the member 24.

It is to be understood that the toggle mechanism described for moving the bonding tip 40 with respect to the head 12 is only one of a number of possible arrangements that can be used for accomplishing the desired motion.

Although certain embodiments of the invention have been shown in the drawings and described in the specification, it is to be understood that the invention is not limited thereto, is capable of modification and can be arranged without departing from the spirit and scope of the invention.

We claim:
1. In a method of compliant bonding, wherein a bonding tip is coupled to and supported by a bonding head, wherein the bonding tip moves reciprocally with the bonding head toward and in contact with a workpiece to bond it and away from such workpiece, and wherein a compliant member is positioned with respect to the head between the bonding tip and the workpiece, the improvement comprising:
   moving the tip independently of, and relative to, the head to engage a portion of the compliant member, to establish tension in such member and to establish a precise configuration of the engaged portion of said member relative to the tip, such tension and precise configuration being established prior to movement of the head;
   maintaining the position of the tip with respect to the head after establishing the tension and the precise configuration in the compliant member; and
   moving simultaneously the head, the tip and the compliant member toward the workpiece to effect the bond.

2. The method of claim 1, wherein the movement of the tip is effectuated by a toggle linkage operated by a cam.

3. The method of claim 1, further comprising suspending the compliant member between at least two vertical supporting devices fixedly mounted to the head.

4. A method of compliant bonding, which comprises the steps of:
- suspending a compliant member between at least two supporting devices;
- aligning the compliant member relative to a bonding tip;
- aligning the workpiece with respect to the tip to thereby align the workpiece to the compliant member;
- operating the bonding tip to move the tip, while maintaining the supporting devices stationary, relative to a bonding head that supports such tip to engage a portion of the compliant member, to establish tension in such member and to establish a precise configuration of the engaged portion of said member relative to the tip, such tension and precise configuration being established prior to movement of the head;
- maintaining the position of the tip with respect to the head after establishing the tension and the precise configuration in the compliant member; and
- moving simultaneously the head, the tip and the compliant member toward the workpiece to effect a bond thereon.

5. The method of claim 4, wherein the workpiece is removably adhered to the compliant member prior to bonding and released from the compliant member after bonding.

6. The method of claim 4, wherein the bonding tip moves to pickup the workpiece after the tip has engaged one side of the compliant member to removably adhere such workpiece to the other side of the compliant member.

7. In a method of compliant bonding articles with a bonding head having a bonding tip movable along a bonding axis, the improvement which comprises the steps of:
- indexing a compliant member relative to the bonding tip to align precisely the compliant member with respect to the tip and the bonding axis;
- aligning precisely one of the articles with respect to the bonding tip;
- moving the bonding tip with respect to the bonding head by extending a toggle linkage connected to the tip to establish tension in the portion of the compliant member intersecting the bonding axis and to establish intimate contact between the tip and the member, such tension and intimate contact being established prior to movement of the head;
- maintaining the position of the tip with respect to the head after establishing the tension and the intimate contact with the compliant member;
- moving simultaneously the head, the tip and the compliant member toward the aligned article to bond it; and
- releasing said tip from said member by retracting the linkage after the bonding of the aligned article to permit progressive indexing of the member.

8. In a method of compliant bonding articles, the improvement which comprises:
- suspending a strip of compliant bonding material between at least two supporting devices;
- indexing the strip relative to a bonding tip to align the strip with respect to the tip;
- aligning one of the articles with respect to the bonding tip;
- extending a toggle linkage connected to the bonding tip to produce relative motion between the tip and the supporting devices to engage the tip with the suspended strip, to establish tension in such strip and to establish intimate contact between the tip and the strip, such tension and intimate contact being established prior to movement of the head;
- maintaining the position of the tip with respect to the supporting devices after establishing the tension and the intimate contact with the compliant member;
- moving simultaneously the tip, the toggle linkage, the supporting devices and the strip to move such strip into bonding contact with the aligned article to bond it;
- retracting the toggle linkage after the bonding of the aligned article to disengage the tip from the suspended strip; and
- indexing the strip to move it relative to the tip in preparation for another bonding operation.

9. A method of compliantly bonding articles, which comprises:
- suspending a single strip of compliant bonding material between at least two supporting devices, the material having a predetermined coefficient of thermal expansion and the strip having a series of spaced apertures and pocket-like depressions within the area of each aperture;
- indexing accurately the suspended strip relative to a spaced, movable, flat bonding tip to align one of the depressions and its aperture with respect to the tip, said indexing being independent of the coefficient of thermal expansion of the material of the strip, the accuracy of said indexing being aided by such independence of such coefficient and by said depressions;
- aligning one of the articles with respect to the bonding tip;
- heating the bonding tip;
- extending a toggle linkage connected to the bonding tip synchronously with the indexing of the strip, while maintaining the supporting devices stationary relative to the bonding tip (a) to engage the heated tip with said aligned depression of the suspended strip to thereby produce tension in the strip, (b) to form a flat contact between the flat tip and the strip, and (c) to assure intimate contact between the heated tip and said depression of the strip, such tension, flat contact and intimate contact being achieved prior to movement of the supporting devices;
- moving linearly and simultaneously the heated bonding tip, the supporting devices and the compliant member, while maintaining the position of the tip with respect to the supporting devices after the tensioning and contacting of the compliant member, to bond the aligned article with said depression of the tensioned strip and the bonding tip;
- retracting the toggle linkage after the bonding of the aligned article to disengage the tip from the suspended strip and to eliminate the tension in the strip; and
- indexing the untensioned strip to move it relative to, and in alignment with, the tip in preparation for another bonding step.

* * * * *